(12) United States Patent
Aga et al.

(10) Patent No.: US 11,035,900 B2
(45) Date of Patent: Jun. 15, 2021

(54) SCAN-CHAIN TESTING VIA DESERIALIZER PORT

(71) Applicant: CREDO TECHNOLOGY GROUP LIMITED, Grand Cayman (KY)

(72) Inventors: Arshan Aga, Mountain View, CA (US); Nianwei Xing, San Jose, CA (US)

(73) Assignee: Credo Technology Group, Ltd, Grand Cayman (KY)

(*) Notice: Subject to any disclaimer, the term of this patent is extended or adjusted under 35 U.S.C. 154(b) by 133 days.

(21) Appl. No.: 16/240,697

(22) Filed: Jan. 4, 2019

(65) Prior Publication Data

US 2020/0041565 A1 Feb. 6, 2020

Related U.S. Application Data

(60) Provisional application No. 62/712,799, filed on Jul. 31, 2018.

(51) Int. Cl.
*G01R 31/3177* (2006.01)
*G01R 31/317* (2006.01)
*H03M 9/00* (2006.01)

(52) U.S. Cl.
CPC ... *G01R 31/3177* (2013.01); *G01R 31/31723* (2013.01); *H03M 9/00* (2013.01)

(58) Field of Classification Search
None
See application file for complete search history.

(56) References Cited

U.S. PATENT DOCUMENTS

| 6,295,323 B1* | 9/2001 | Gabara | H04L 5/20 375/257 |
| 6,653,957 B1 | 11/2003 | Patterson et al. | |
| 7,739,567 B2* | 6/2010 | Vandivier | G01R 31/318572 714/727 |

(Continued)

OTHER PUBLICATIONS

"Herrera", "versatile-precision-single-ended-to-differential-converter", Oct. 2012, Analog Dialogue 46-10 Back Burner (Year: 2012).*

(Continued)

*Primary Examiner* — Cynthia Britt
*Assistant Examiner* — Matthew W Wahlin
(74) *Attorney, Agent, or Firm* — Ramey & Schwaller, LLP; Daniel J. Krueger

(57) ABSTRACT

Scan-chain testing of a semiconductor chip may be performed entirely via a deserializer port. In one illustrative device embodiment, a semiconductor chip includes at least one deserializer having: a serial-to-parallel converter coupled to a pair of differential signal input pins; a scan-chain receiver circuit coupled to at least one of the pair of differential signal input pins in parallel with the serial-to-parallel converter to receive a scan-chain test input data stream; a scan-chain test logic circuit that loads the scan-chain test input data stream into a scan chain and extracts a scan-chain test result data stream from the scan chain; and a scan-chain transmit circuit that drives the pair of differential signal input pins with the scan-chain test result data stream. If multiple SerDes blocks exist on the chip, the deserializer ports may be employed in parallel for input and output of test data streams.

15 Claims, 4 Drawing Sheets

(56) References Cited

U.S. PATENT DOCUMENTS

| | | | |
|---|---|---|---|
| 8,935,583 B2* | 1/2015 | Jun ................ | G01R 31/318547 714/726 |
| 2012/0062316 A1* | 3/2012 | Huang ................ | H03F 3/45475 330/69 |
| 2014/0189452 A1* | 7/2014 | Sonawane ...... | G01R 31/318552 714/727 |
| 2015/0185285 A1* | 7/2015 | Kovalev ............ | G01R 31/3172 714/727 |

OTHER PUBLICATIONS

IEEE Standard Test Access Port and Boundary-Scan Architecture, IEEE Std 1149.1-2001 (Revision of IEEE Std 1149.1-1990) (Jun. 14, 2001) The Institute of Electrical and Electronics Engineers, Inc. New York, 2001.

* cited by examiner

SCAN-CHAIN TESTING VIA DESERIALIZER PORT

CROSS-REFERENCE TO RELATED APPLICATION

This application claims the benefit of U.S. Provisional Patent Application No. 62/712,799 filed 31 Jul. 2018, the disclosures of which are incorporated herein by reference in its entirety.

BACKGROUND

As the performance of digital integrated circuits continues to improve, they increasingly rely on serializer/deserializer ("SerDes") blocks to provide high bandwidth communications with other components and devices. In many cases, packaged semiconductor chips employ multiple SerDes blocks, each coupled to multiple pins, thus requiring a substantial number of pins and potentially leaving an insufficient number of pins for other necessary functions such as scan chain testing. (The term "pins" is employed herein as a generic term which includes not only traditional package pins, but also balls, pads, electrodes, and all other forms of conductive connectors for electrically attaching the on-chip circuitry to off-chip conductors for power and signal transfer.)

One existing solution appears in U.S. Pat. No. 7,739,567 ("Vandivier"), employing a deserializer to selectively receive scan chain test data ("scan-in data") on the SerDes receiver pins and a serializer to selectively transmit scan chain test results ("scan-out data") on the SerDes driver pins. This solution may be suitable for many applications, but it may provide inadequate scan testing of the serializer block because the SerDes driver pins are being otherwise employed for the scan-out data.

SUMMARY

Accordingly, there are disclosed herein techniques for scan-chain testing of a semiconductor chip via a deserializer port. In one illustrative device embodiment, a semiconductor chip includes at least one deserializer having: a serial-to-parallel converter coupled to a pair of signal input pins which form a differential input; a scan-chain receiver circuit coupled to at least one of the pair of signal input pins in parallel with the serial-to-parallel converter to receive a scan-chain test input data stream; a scan-chain test logic circuit that loads the scan-chain test input data stream into a scan chain and extracts a scan-chain test result data stream from the scan chain; and a scan-chain transmit circuit that drives the pair of signal input pins with the scan-chain test result data stream.

One illustrative method embodiment for manufacturing a semiconductor chip having at least one deserializer includes: connecting a pair of signal input pins that form a differential input to a serial-to-parallel converter; coupling at least one of the signal inputs pins to a scan-chain receiver circuit in parallel with the serial-to-parallel converter to receive a scan-chain test input data stream; connecting the scan-chain receiver circuit to a scan-chain test logic circuit to load the scan-chain test input data stream into a scan chain and to extract a scan-chain test result data stream from the scan chain; and providing a scan-chain transmit circuit to drive another pair of signal input pins with the scan-chain test result data stream.

Each of the foregoing embodiments may be implemented individually or in combination, and may be implemented with any one or more of the following features in any suitable combination: 1. the scan-chain receiver circuit is coupled in parallel with the serial-to-parallel converter to each of the differential signal input pins in said pair. 2. the scan-chain transmit circuit supplies the scan-chain test result data stream as a common mode output signal on the pair of signal input pins. 3. the scan-chain receiver circuit receives the scan-chain test input data stream concurrently with transmission of the scan-chain test result data stream by the scan-chain transmit circuit. 4. the at least one deserializer includes an impedance connected between the differential signal input pins, and wherein the scan-chain transmit circuit supplies the scan-chain test result data stream to a center tap of said impedance. 5. a second deserializer having a second pair of signal input pins that the scan-chain transmit circuit drives with the scan-chain test result data stream as a second common mode output signal. 6. the second common mode output signal and the common mode output signal for said at least one deserializer together convey the scan-chain test result data stream as a differential signal. 7. the scan-chain transmit circuit supplies the scan-chain test result data stream as a differential output signal on the pair of differential signal input pins. 8. the scan-chain receiver circuit and the scan-chain transmit circuit are only enabled at separate times. 9. the scan-chain transmit circuit drives the signal input pins independently to convey different portions of the scan-chain test result data stream as two parallel data streams. 10. said coupling connects each of the signal pins in said pair to the scan-chain receiver circuit in parallel with the serial-to-parallel converter. 11. the scan-chain transmit circuit is configured to supply the scan-chain test result data stream as a common mode output signal on the pair of signal input pins. 12. configuring the scan-chain receiver circuit to receive the scan-chain test input data stream concurrently with transmission of the scan-chain test result data stream by the scan-chain transmit circuit. 13. connecting a center-tapped impedance between the signal input pins. 14. said providing includes configuring the scan-chain transmit circuit to supply the scan-chain test result data stream to a center tap of said center-tapped impedance. 15. providing a second deserializer having a second pair of signal input pins that the scan-chain transmit circuit drives with the scan-chain test result data stream as a second common mode output signal.

Figure 1:
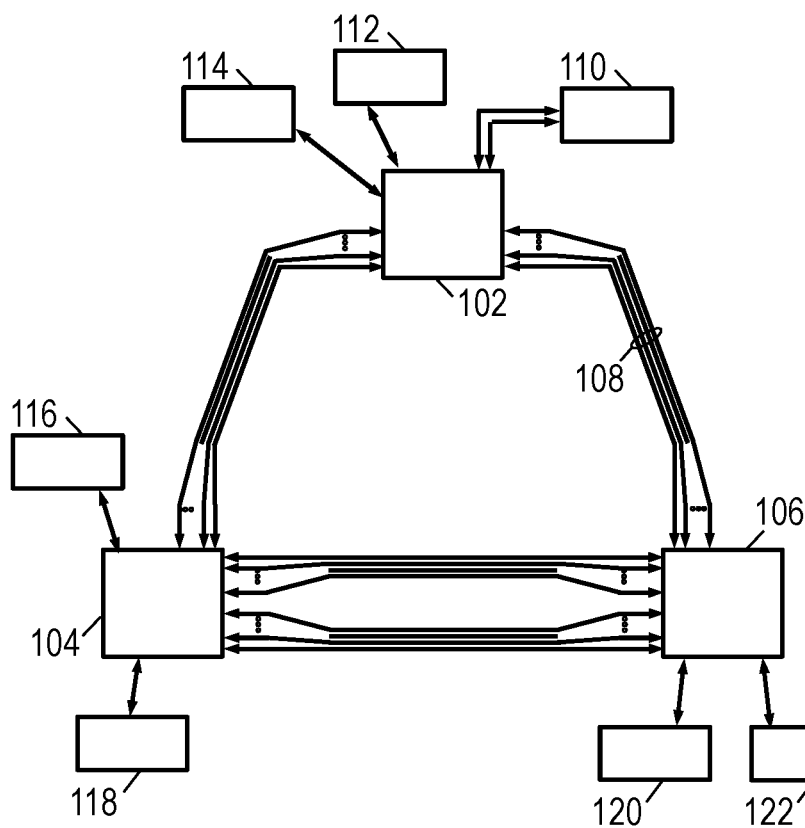
FIG. 1 is an illustrative network employing high bandwidth communications.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

DETAILED DESCRIPTION

The disclosed apparatus and methods are best understood in the context of the larger environments in which they operate. Accordingly, FIG. 1 shows an illustrative communications network 100 having high bandwidth communications links 108 interconnecting nodes 102, 104, 106 (representing switches, routers, base stations, gateways, and other forms of communications equipment) that direct and relay communications signals between terminal nodes 110-122 (which may represent mobile devices, portable computers, workstations, servers, network-attached storage systems, and other such communications sources and destinations). The communications network 100 may be or include, for example, the Internet, a wide area network, or a local area network. The disclosed principles may also be employed for communications links such as backplanes, circuit board buses, input/output buses, and inter-component communications buses. In these examples, each terminus of the communications link may be an integrated circuit having one or more SerDes blocks.

Communication links 108 may be fiberoptic cables having bundles of optical fibers each carrying multiple modulated light signals on corresponding channels. Many fiberoptic cables have multiple bundles of optical fibers, with each fiber carrying multiple channels. With such dense packing of information signals, highly integrated communications transceivers are advantageous for efficient interfacing with communications equipment. It is desirable to combine the integrated circuits for multiple transmitter modules and multiple receiver modules into a single package.

Figure 2:
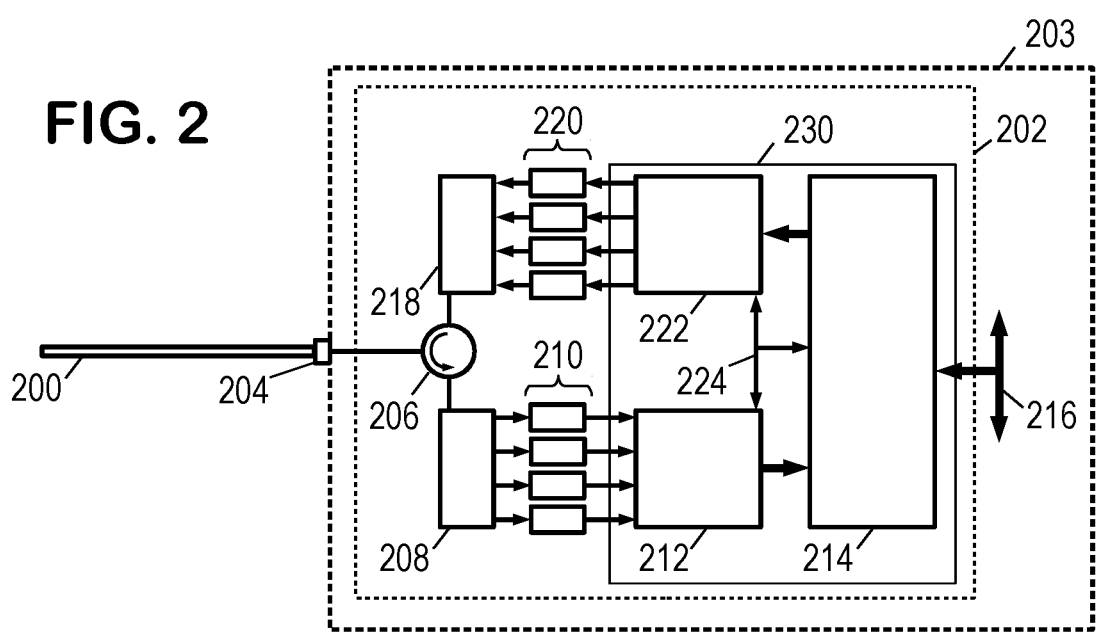
FIG. 2 is a block diagram of an illustrative multi-channel transceiver.

FIG. 2 shows an individual optical fiber 200 coupled to an illustrative transceiver 202 in a terminal node 203. (Each optical fiber in a bundle may be coupled to a different transceiver in the terminal node.) An optical connector 204 couples the fiber 200 to an optical circulator 206. The circulator 206 forwards incoming light signals to a channel splitter 208, which separates the various channels and provides one to each detector 210. The multiple detectors 210 each convert one of the light signals into an electrical receive signal. A multichannel receiver 212 operates on the electrical receive signals to extract the corresponding streams of digital data. An interface module 214 buffers the streams of digital data and converts them to a suitable format for communications of the terminal node's internal bus 216, in accordance with a standard I/O bus protocol. In some embodiments, the conversion performed by the interface module 214 includes error correction and payload extraction.

From the internal bus 216, the interface module 214 also accepts digital data for transmission. In at least some embodiments, the interface module 214 packetizes the data with appropriate headers and end-of-frame markers, optionally adding a layer of error correction coding and/or a checksum. A multichannel transmitter 222 accepts the transmit data streams from interface module 214 and converts the digital signals into analog electrical drive signals for emitters 220, causing the emitters to generate optical signals that are coupled to a channel coupler 218. The channel coupler 218 provides them as a combined optical signal to the circulator 206, which forwards it as an outgoing signal to optical fiber 200.

Light signal modulation can be performed at extremely high symbol rates, necessitating that the receiver digitize the electrical receive signals at correspondingly high sampling rates, without sacrificing the timing precision required for maintaining an adequate signal-to-noise ratio. The same observation holds true for electrical signals over conductive channels and electromagnetic signals over wireless channels—modulation can be performed at extremely high symbol rates, necessitating that the receiver also operate at correspondingly high sampling rates while maintaining adequate timing precision to preserve the signal to noise ratio.

Commonly used in such high symbol rate systems are a pair of functional blocks known as Serializer/Deserializer blocks. Serializer blocks convert parallel data streams into (high symbol rate) serial data streams for transmission over a serial channel, while Deserializer blocks convert (high symbol rate) serial data streams received from a serial channel into parallel data streams. These conversion blocks are often referred to by the generic term "SerDes". Serializer blocks are coupled to, or may incorporate, channel-specific transmitters, while deserializer blocks are coupled to, or incorporate, channel-specific receivers.

In the embodiment of FIG. 2, the multichannel receiver 212, multichannel transmitter 222, and interface module 214, are packaged together as a monolithic integrated circuit or a multichip module package 230. Though the illustrated example is shown as a 4-channel transceiver for simplicity, in practice the transceiver chip or package may employ 32, 64, or more SerDes blocks communicating on differential signal lines, requiring the chip to employ hundreds of pins for SerDes communications.

Figure 3:
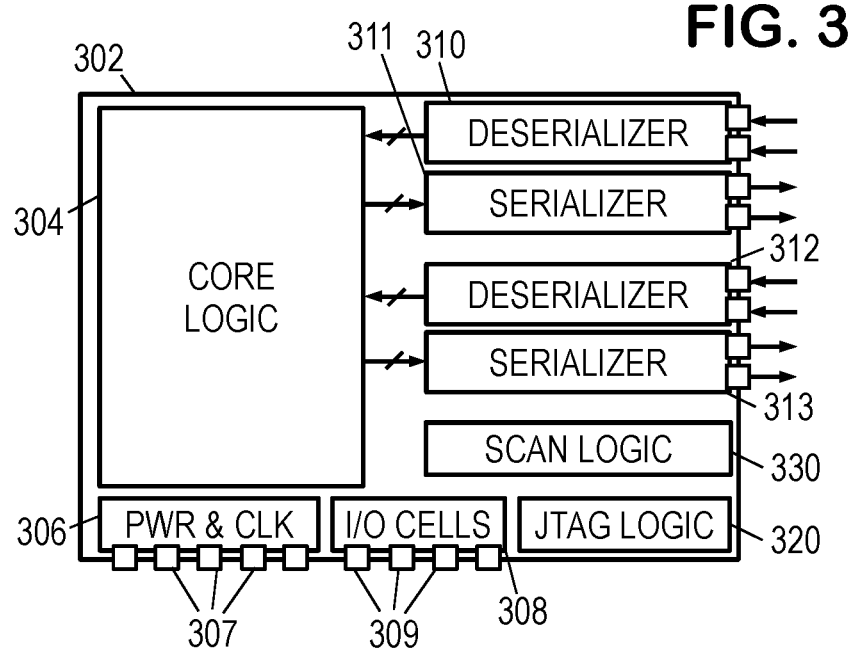
FIG. 3 is a block diagram of an illustrative transceiver chip having multiple serializer/deserializer ("SerDes") ports.

FIG. 3 is a block diagram of an illustrative transceiver chip 302 having multiple serializer/deserializer ("SerDes") ports. Transceiver chip 302 includes a core logic circuit 304 to implement the intended function of the chip, e.g., as a switch, router, base station, gateway, or network interface for a host device. A power supply and clock circuit 306 drives the voltage rails and clock signal lines for all the circuitry on transceiver chip 302, typically using the power and clock signals received via a set of pins 307. A set of traditional I/O pins 309 couples a corresponding set of I/O cells 308 to off-chip signal lines for low frequency communication, configuration, and/or control signals, e.g., chip_enable, sleep, I2C, or dedicated signal lines. I/O cells 308 typically include voltage clamps, electrostatic discharge protection devices, selectable drivers, and/or other circuits that frequency-limit the signals communicated via the traditional I/O pins 309.

For high-speed communications, the core logic circuit 304 employs multiple SerDes ports. For convenience, only two ports are shown, but in practice many more may be present. A first SerDes port includes a deserializer 310 and a serializer 311. A second SerDes port includes a deserializer 312 and a serializer 313. Each of the serializers and deserializers may employ differential signaling for off-chip communications.

The transceiver chip 302 may further include built-in test modules such as a JTAG logic 320 and a scan-chain test logic module 330. JTAG logic 320 traditionally provides boundary scan testing of the off-chip signal connections, while scan-chain test logic module 330 may provide for testing the internal logic and/or inter-module connections of the transceiver chip 302. Scan-chain testing preferably provides test coverage that is complete as possible given the restrictions on testing time. To provide better coverage, the high-speed SerDes signal lines may be employed to more quickly communicate test input and test result vectors onand off-chip, thereby enabling the use of longer scan chains while still limiting the test duration.

Figure 4:
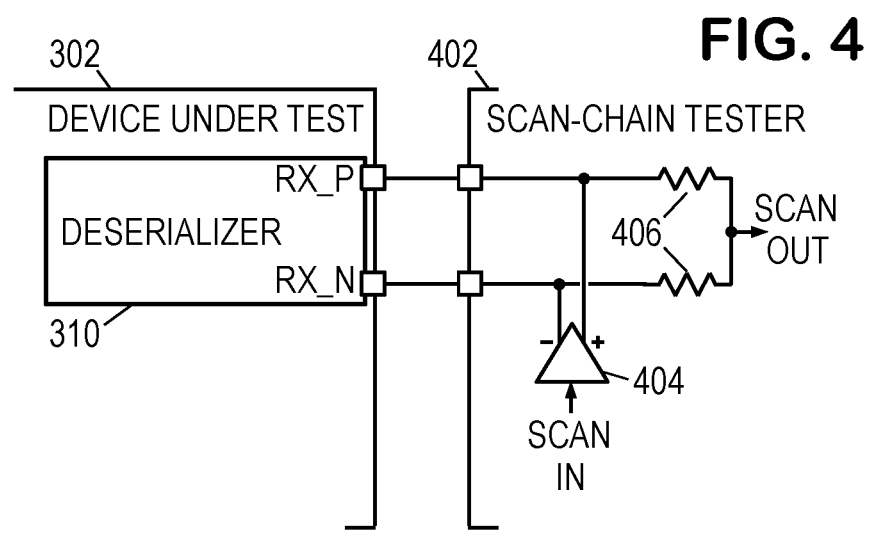
FIG. 4 is a tester coupling option for a deserializer port.

Though the deserializers are employed solely for receiving during normal operations, they may be repurposed for sending and receiving test vectors during testing operations. FIG. 4 shows an illustrative coupling between a test system 402 and a device under test such as a transceiver chip 302. In the illustrated example, the test system 402 includes a driver 404 that drives test input vectors as a differential signal between the differential inputs RX_P, RX_N of a deserializer 310, and a balanced impedance configuration 406 that extracts a common mode signal from the deserializer inputs as a test result vector signal. Note that this configuration enables concurrent input and output of test data via the RX_P and RX_N pins.

The input pins for the transceiver chip's other deserializer (s) 312 may also be similarly coupled to the test system 402 to be operated concurrently with the illustrated configuration, thereby enabling additional scan test input and output vectors to be communicated with other scan chains on chip 302. The test system 402 further provides power, clock, and low frequency communication, configuration, and/or control signals as needed to enable the test mode of chip 302 and perform testing thereon. Other than the particular test data communication technique disclosed herein, the testing may otherwise be conducted in accordance with existing standard test protocols such as, e.g., the JTAG standard IEEE 1149.6.

Figure 5:
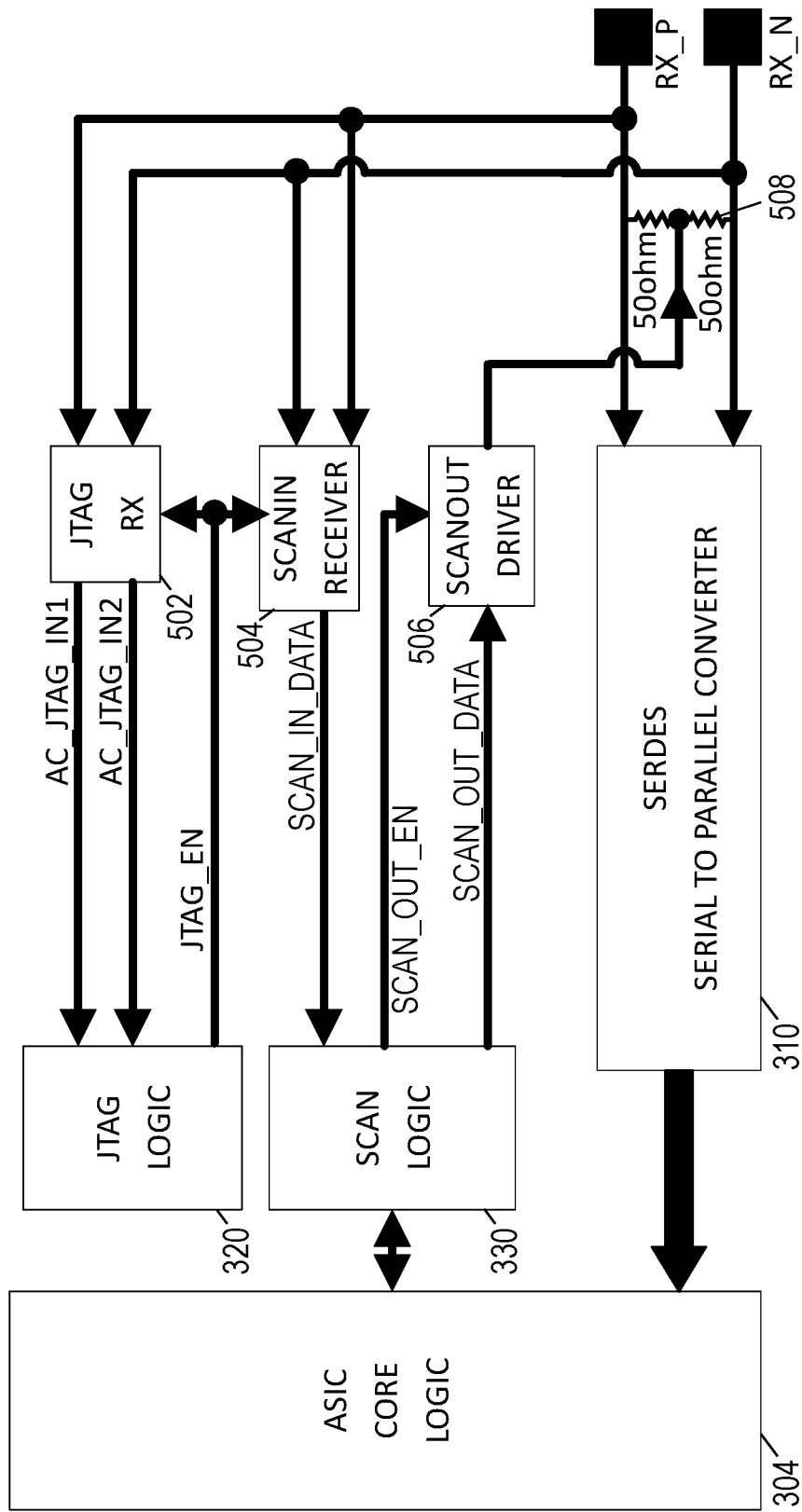
FIG. 5 is a block diagram of a deserializer port configured for sending and receiving scan-chain test data.
Figure 6:
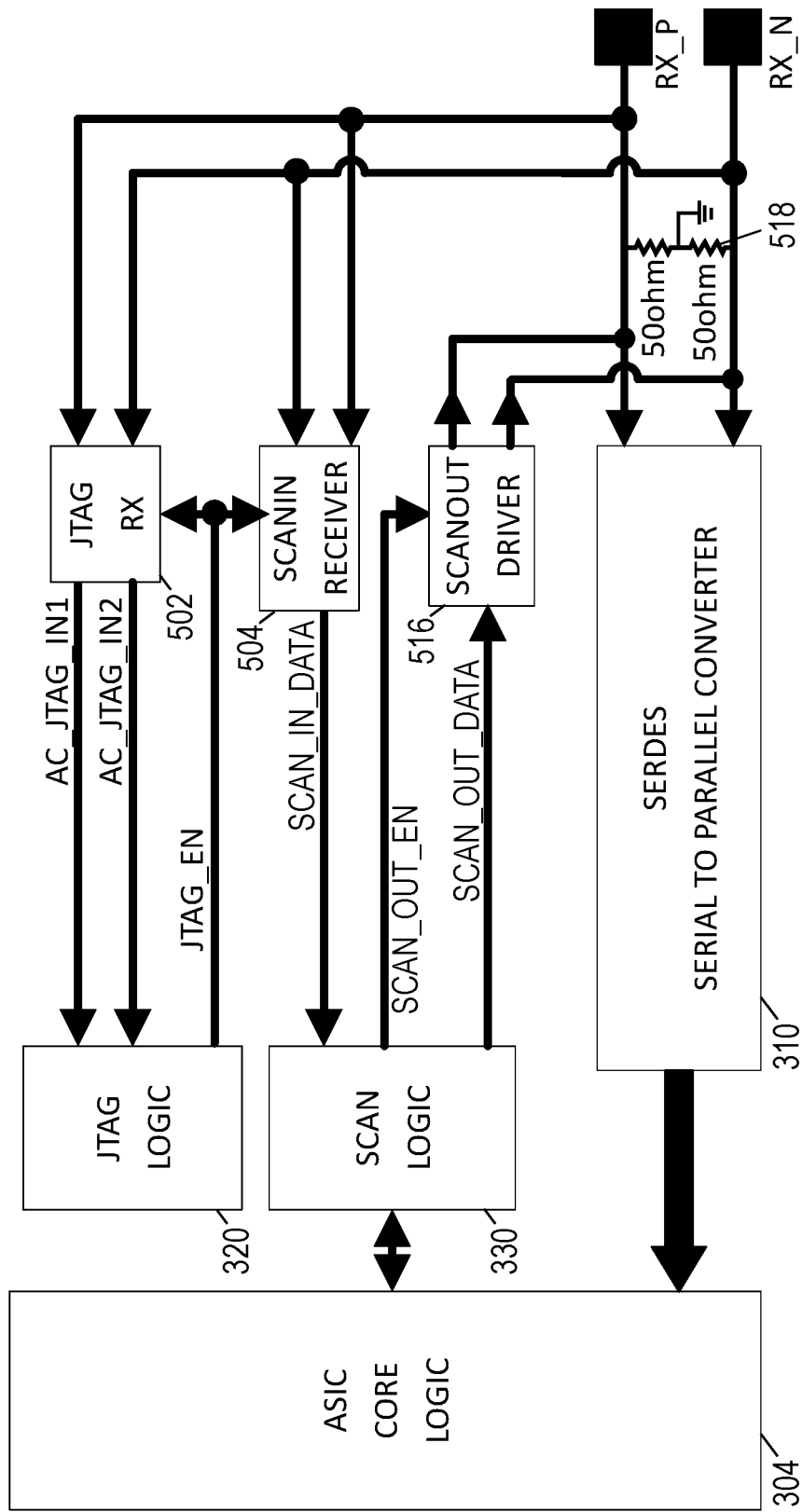
FIG. 6 is a block diagram of a variation on the design of FIG. 5.

To configure the deserializer input pins for sending and receiving test data, circuitry such as that shown in FIGS. 5 and 6 may illustratively be employed. The RX_P pin connects directly to the serial-to-parallel converter 310, a JTAG receiver module 502, and a scan-chain receiver ("Scan-In") module 504. The RX_N pin is similarly connected to each of these modules to provide, in cooperation with the RX_P pin, a differential input signal to the modules—at least for normal operations and for the scan-chain testing; for JTAG testing, the RX_P and RX_N pins may be driven independently. In other contemplated embodiments, the RX_P and RX_N pins may be driven independently for scan-chain testing, though this may require time multiplexing of the test input and output vector streams.

When the JTAG module asserts a test mode enable (JTAG_EN) signal, the JTAG receiver module 502 conditions the RX_P and RX_N pin signals and supplies them to the JTAG logic module 320 as JTAG IN1 and JTAG IN2 test data signals. In response to the same enable signal or a separate enable signal, the scan-chain receiver module 504 converts the differential signal from the RX_P and RX_N pins into a single-ended Scan_In_Data signal for the scan-chain test logic module 330.

In the embodiment of FIG. 5, a scan-chain transmit module ("Scan-Out driver") 506 is connected to a center tap of a 100-ohm termination impedance 508 between the RX_P and RX_N pins, and is thereby coupled to each pin by a 50-ohm impedance. When the scan-chain test logic module 330 asserts an output enable (Scan_Out_En) signal, the Scan-Out driver 506 drives the scan-chain test output signal to the center tap to provide a common-mode output signal on the RX_P and RX_N pins. This approach provides a very unobtrusive way to implement the driver since the impedance reduces any effect of the driver's output impedance on the sensitive and high speed RX_P and RX_N terminals.

If the capacitance and stray resistance of the driver circuit can be tolerated, the embodiment of FIG. 6 may be preferred since there will be less loss from the driver output to the load. In this embodiment, the center tap of the termination impedance 518 is coupled to ground or a node having a fixed voltage midway between the high and low logic levels on the RX_P and RX_N pins. The Scan-Out driver 516 now directly drives the SERDES_RX_P or SERDES_RX_N nodes or drives them differentially. In both embodiments, the enable signals and routing of the test input data may be controlled by control registers in the JTAG logic 320 or configuration registers in the core logic 304.

The illustrated embodiments enable the input and output streams of test data to employ the SerDes receiver pins while bypassing both the serializer and deserializer functionality. Because this functionality is not needed for streaming the test vectors, it can be included in the scan-chain test coverage. More specifically, the scan-chain testing operation can verify operation of the SerDes parallel-to-serial converter and the serial-to-parallel converter, enabling the testing complexity to be reduced and potentially further reducing test time.

The foregoing principles can be extended for semiconductor chips having multiple deserializers. Each deserializer may include a scan-in receiver that can operate in parallel with the scan-in receivers of other deserializers to enable faster loading of scan-chain test input vectors into scan chains. Similarly, each deserializer may include a scan-out driver that can operate in parallel with the scan-out drivers of other deserializers to enable faster output of scan-chain test result data streams. In some contemplated embodiments, pairs of deserializer ports may be driven with common mode signals that together form a differential output signal.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A semiconductor chip that comprises at least one deserializer having:
    a serial-to-parallel converter coupled to a pair of signal input pins that form a differential pair;
    a scan-chain receiver circuit coupled to at least one signal input pin of the pair of signal input pins in parallel with the serial-to-parallel converter to receive a scan-chain test input data stream;
    a scan-chain test logic circuit that loads the scan-chain test input data stream into a scan chain and extracts a scan-chain test result data stream from the scan chain; and
    a scan-chain transmit circuit that drives the pair of signal input pins with the scan-chain test result data stream as a common mode output signal,
    wherein the scan-chain receiver circuit receives the scan-chain test input data stream concurrently with transmission of the scan-chain test result data stream by the scan-chain transmit circuit.

2. The semiconductor chip of claim 1, wherein the scan-chain receiver circuit is coupled in parallel with the serial-to-parallel converter to each signal input pin in the pair of signal input pins.

3. The semiconductor chip of claim 1, wherein the at least one deserializer includes an impedance connecting the pair of signal input pins to one another, and wherein the scan-chain transmit circuit supplies the scan-chain test result data stream to a center tap of said impedance.

4. The semiconductor chip of claim 1, further comprising a second deserializer having a second pair of signal input pins that the scan-chain transmit circuit drives with the scan-chain test result data stream as a second common mode output signal.

5. The semiconductor chip of claim 1, wherein the scan-chain transmit circuit supplies the scan-chain test result data stream as a differential output signal on the pair of signal input pins.

6. The semiconductor chip of claim 5, wherein the scan-chain receiver circuit and the scan-chain transmit circuit are only enabled at separate times.

7. The semiconductor chip of claim 1, wherein the scan-chain transmit circuit drives each signal input of the pair of signal input pins independently to convey different portions of the scan-chain test result data stream as two parallel data streams.

8. A manufacturing method for a semiconductor chip having at least one deserializer, the method comprising:
    connecting a pair of signal input pins that form a differential pair to a serial-to-parallel converter;
    coupling at least one signal input pin of the pair of signal inputs pins to a scan-chain receiver circuit in parallel with the serial-to-parallel converter to receive a scan-chain test input data stream;
    providing a scan-chain test logic circuit that loads the scan-chain test input data stream into a scan chain and extracts a scan-chain test result data stream from the scan chain;
    providing a scan-chain transmit circuit to drive the pair of signal input pins with the scan-chain test result data stream as a common mode output signal; and
    enabling the scan-chain receiver circuit to receive the scan-chain test input data stream concurrently with transmission of the scan-chain test result data stream by the scan-chain transmit circuit.

9. The method of claim 8, wherein said coupling connects each signal input pin of the pair of signal input pins to the scan-chain receiver circuit in parallel with the serial-to-parallel converter.

10. The method of claim 8, further comprising:
    connecting a center-tapped impedance between the pair of signal input pins,
    wherein said providing includes configuring the scan-chain transmit circuit to supply the scan-chain test result data stream to a center tap of said center-tapped impedance.

11. The method of claim 8, further comprising: providing a second deserializer having a second pair of differential signal input pins that the scan-chain transmit circuit drives with the scan-chain test result data stream as a second common mode output signal.

12. The method of claim 11, wherein the second common mode output signal and the common mode output signal for said at least one deserializer together convey the scan-chain test result data stream as a differential signal.

13. The method of claim 8, wherein the scan-chain transmit circuit supplies the scan-chain test result data stream as a differential output signal on the pair of signal input pins.

14. The method of claim 13, wherein the scan-chain receiver circuit and the scan-chain transmit circuit are only enabled at separate times.

15. The method of claim 8, wherein the scan-chain transmit circuit drives the differential signal input pins independently to convey different portions of the scan-chain test result data stream as two parallel data streams.

* * * * *